(12) United States Patent
Lansford et al.

(10) Patent No.: US 6,689,258 B1
(45) Date of Patent: Feb. 10, 2004

(54) ELECTROCHEMICALLY GENERATED REACTANTS FOR CHEMICAL MECHANICAL PLANARIZATION

(75) Inventors: Christopher H. Lansford, Austin, TX (US); Jeremy S. Lansford, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/135,702

(22) Filed: Apr. 30, 2002

(51) Int. Cl.⁷ .............................. C25D 17/00; C25B 9/00
(52) U.S. Cl. .................................. 204/224 M; 204/269
(58) Field of Search .................... 204/224 M, 267–269; 205/656, 662, 663

(56) References Cited

U.S. PATENT DOCUMENTS

| | | | |
|---|---|---|---|
| 4,995,953 A | * 2/1991 | Yee .............................. 205/656 |
| 5,139,624 A | * 8/1992 | Searson et al. ............. 205/656 |
| 5,464,509 A | * 11/1995 | Mlcak et al. ................ 205/656 |
| 5,597,346 A | 1/1997 | Hempel, Jr. ................ 451/287 |
| 5,679,065 A | 10/1997 | Henderson .................. 451/290 |
| 5,681,215 A | 10/1997 | Sherwood et al. .......... 451/388 |
| 5,695,392 A | 12/1997 | Kim ............................ 451/288 |
| 5,803,799 A | 9/1998 | Volodarsky et al. ........ 451/288 |
| 5,846,398 A | * 12/1998 | Carpio ........................ 205/775 |
| 5,931,725 A | 8/1999 | Inaba et al. ................. 451/288 |
| 5,941,758 A | 8/1999 | Mack ............................ 451/41 |
| 6,004,193 A | 12/1999 | Nagahara et al. ........... 451/285 |
| 6,017,437 A | * 1/2000 | Ting et al. .............. 204/267 X |
| 6,093,089 A | 7/2000 | Chen et al. .................. 451/288 |
| 6,110,025 A | 8/2000 | Williams et al. ............ 451/286 |
| 6,116,992 A | 9/2000 | Prince ......................... 451/286 |
| 6,171,467 B1 | * 1/2001 | Weihs et al. ........... 204/224 M |
| 6,224,472 B1 | 5/2001 | Lai et al. .................... 451/398 |
| 6,440,295 B1 | 8/2002 | Wang .......................... 205/640 |

OTHER PUBLICATIONS

Cambridge University; *Activation Polarisation:The Butler–Volmer Equation* (http://www2.eng.cam.ac.uk/~bt206/SOFCModeling/ActivationPolarisation/Activation%20Polarisation.pdf); all; Apr. 1992.

Ecole Polytechnic Federale de Lausanne; *Steady State Voltammetry*; dfcwww.epfl.ch/le/ICP3–Lecture notes/Electrochemical Methods/Electrochemistry Course 1.pdf; all; unknown, (no date).

Ruth Dejule; *CMP Grows in Sophistication*; Semiconductor International; http://www.semiconductor.net/semiconductor/issues/Issues/1998/nov98/docs/feature1.asp; pp. 1–6; Nov. 1998.

Alexander E. Braun; Slurries and Pads Face 2001 Challenges; Semiconductor International; http://www.semiconductor.net/semiconductor/issues/Issues/1998/nov98/docs/feature2.asp; pp. 1–9; Nov. 1998.

Tanner McCarron; The Silver/Silver Chloride Reference Electrode; www.tannerm.comhttp://www.tannerm.com/electrochemistry/Ag ref/Ag ref.htm; pp. 1–7; 1998, (no month).

Karin M. Bailss et al.; *Active Spatiotemporal Control of Electrochemical Reactions by Coupling to In–Plane Potential Gradients*–J. Phys. Chem. B 2001, 105; pp. 8970–8978; & Jun. 19, 2001.

* cited by examiner

*Primary Examiner*—Donald R. Valentine
(74) *Attorney, Agent, or Firm*—Timonthy M. Honeycutt

(57) ABSTRACT

Various methods and apparatus for polishing semiconductor workpieces using electrochemically generated species are disclosed. In one aspect, a method of processing is provided that includes contacting a semiconductor workpiece to a solution, electrochemically generating a chemical species in the solution, and polishing the semiconductor workpiece with the aid of the solution.

20 Claims, 5 Drawing Sheets

ELECTROCHEMICALLY GENERATED REACTANTS FOR CHEMICAL MECHANICAL PLANARIZATION

BACKGROUND OF THE INVENTION

1. Field of the Invention

This invention relates generally to semiconductor processing, and more particularly to chemical mechanical polishing and methods of performing the same.

2. Description of the Related Art

Conventional chemical mechanical planarization or polishing ("CMP") processes involve the planarization of a surface of a wafer or workpiece through the use of an abrasive slurry and various rinses and solvents. Material removal from the workpiece surface is through a combination of abrasive action and chemical reaction. In many processes, a quantity of abrasive slurry is introduced onto a polish pad of the CMP tool and distributed across the surface thereof by means of centrifugal force. Thereafter, one or more wafers are brought into sliding contact with the polish pad for a select period of time.

Conventional slurries normally contain several components, such as one or more types of abrasive particles, a stabilizer that is designed to keep the abrasive particles from going into solution, and one or more oxidizing agents. As the CMP process is consumptive of various slurry constituents, particularly the oxidizer components, it is necessary to replenish the slurry mixture frequently. Sometimes, the need for replenishment stems from the propensity for one or more of the slurry constituents to decompose over time. Hydrogen peroxide as an oxidizer is an example of such a rapidly decomposing constituent. The need for frequent replenishment, of course, increases the overall cost of the CMP process and can lead to variations in the slurry composition used for, and therefore the polish rates of, successive wafers in a given lot or for successive lots. Oxidizing agents like hydrogen peroxide also frequently oxidize organic and metallic components of CMP tools such as tubing or metallic surfaces exposed to slurry.

As design rules shrink and wafer sizes increase, accurate control ofpolishuniformity is critical. Various mechanisms contribute to polish non-uniformity, such as variations in polish pad topography, slurry composition and incoming film profile. Conventional methods of achieving post-polish uniformity focus on adjusting polish rates spatially. This is done through manipulation the local force between the wafer and polishing pad using: (1) conditioning to thin the pad in high-removal regions; (2) air flow behind the pad to push "up" harder in low-removal regions; or (3) application of air pressure behind the wafer to push "down" harder in low-removal regions. While all three of these methods can be effective at a macro scale across the surface of a wafer, the fact that they rely on mechanical schemes means there is little that may be done on a more local scale at various locations on the wafer surface.

Predictable polish time periods again ensure that the polished film is planarized according to recipe and that process variations between successive wafers are minimal. However, conventional CMP processes sometimes do not proceed according to specified time periods. Process aborts are a leading cause of such variations. The causes for aborts are legion and include machine malfunction and slurry composition deviations to name just a few. Regardless of the exact cause, an abort usually results in the termination of the mechanical rotation of the wafer, or polish pad, depending on the tool type. During a normal CMP run, a wafer is exposed to a slurry and polished on a CMP machine for a preselected time period or until some other preselected endpoint is reached. The slurry is allowed to dwell, if at all, on the wafer surfaces for only preselected and relatively short time periods. However, during an abort, the chemical activity associated with the CMP slurry may continue, resulting in a static etch of the surfaces of the wafer exposed to the slurry. This can result in unwanted and substantial etch attack of various structures on the wafer.

The present invention is directed to overcoming or reducing the effects of one or mom of the foregoing disadvantages.

SUMMARY OF THE INVENTION

In accordance with one aspect of the present invention, a method of processing is provided that includes contacting a semiconductor workpiece to a solution, electrochemically generating a chemical species in the solution, and polishing the semiconductor workpiece with the aid of the solution.

In accordance with another aspect of the present invention, a method of processing is provided that includes contacting a surface of a semiconductor workpiece to an aqueous solution, electrochemically generating a chemical species in the aqueous solution that is oxidative of the surface of the semiconductor workpiece, and polishing the surface of the semiconductor workpiece with the aid of the solution.

In accordance with another aspect of the present invention, a processing device is provided that includes a member for polishing a surface of a semiconductor workpiece with the aid of a solution, a working electrode in fluid communication with the solution, and a counter electrode in fluid communication with the solution. A potential source is coupled to the working electrode and the counter electrode for applying a potential difference between the working electrode and the counter electrode to electrochemically generate a chemical species in the solution to aid in the polishing of the surface of the semiconductor workpiece.

In accordance with another aspect of the present invention, a processing device is provided that includes a member for polishing a surface of a semiconductor workpiece with the aid of a solution. A plurality of electrochemical cells is provided. Each of the plurality of electrochemical cells has a working electrode, a counter electrode and a reference electrode in fluid communication with the solution, and a potential source coupled to the working electrode and the counter electrode for applying a potential difference between the working electrode and the counter electrode to electrochemically generate a chemical species in the solution to aid in the polishing of the surface of the semiconductor workpiece.

In accordance with another aspect of the present invention, a processing device is provided that includes a member for polishing a surface of a semiconductor workpiece with the aid of a solution and a plurality of working electrodes in fluid communication with the solution. A counter electrode and a reference electrode are provided in fluid communication with the solution. A plurality of potential sources is coupled to the working electrodes and the counter electrode for applying a potential difference between the working electrodes and the counter electrode to electrochemically generate a chemical species in the solution to aid in the polishing of the surface of the semiconductor workpiece.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
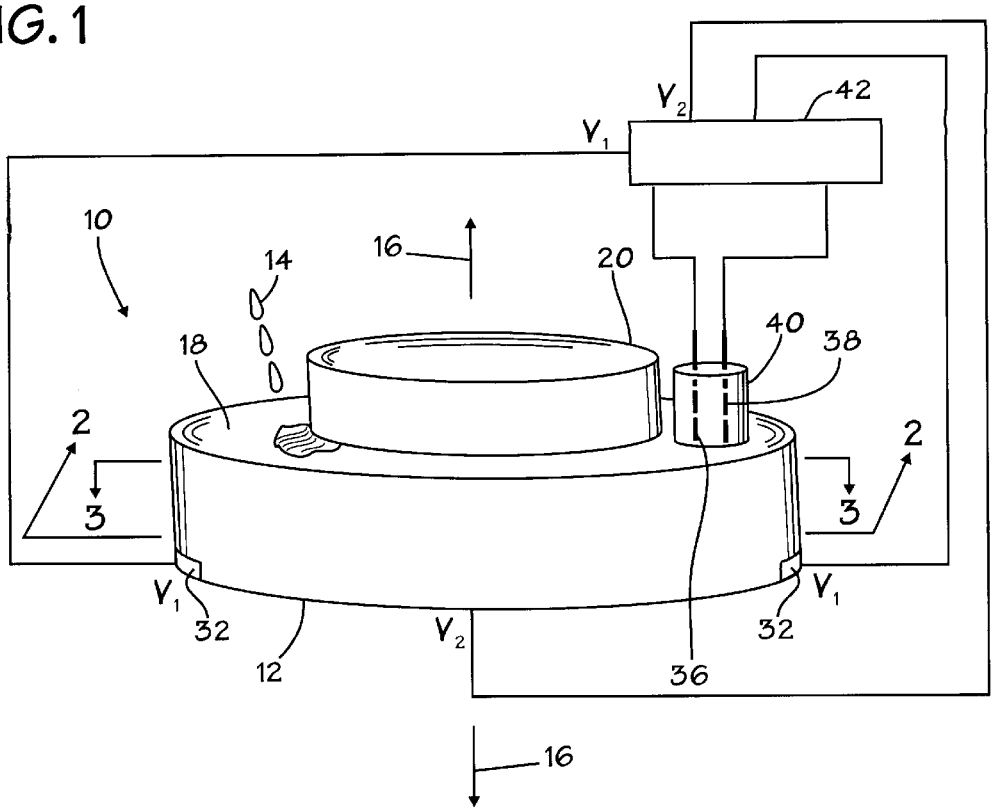
FIG. 1 is a pictorial view of an exemplary embodiment of a chemical mechanical polishing system in accordance with the present invention.

In the drawings described below, reference numerals are generally repeated where identical elements appear in more than one figure. Turning now to the drawings, and in particular to FIG. 1, therein is shown a pictorial view of an exemplary embodiment of a chemical mechanical polishing system 10 (hereinafter CMP system 10) that utilizes electrochemistry for generation of chemical species useful in CMP in accordance with the present invention. For better understanding, FIG. 1 should be viewed in conjunction with FIG. 2, which is a cross-sectional view of FIG. 1 taken at section 2—2. The CMP system 10 includes a member or table 12 that is operable to receive a quantity of an electrically conducting solution 14 dispensed from a reservoir or other dispensing system (not shown). The table 12 maybe motorized and therefore operable to rotate about an axis 16. An upper surface 18 of the table 12 functions as a polish pad surface and will typically be composed of a compliant material such as, for example, rubber, synthetic polymer materials, etc.

The solution or slurry 14 consists of a suspension of abrasive particles, such as, for example, alumina, silica or the like. In an exemplary embodiment, the liquid is deionized water and the abrasive is particulate alumina. As described more fully below, the oxidation aspect of the CMP process may be carried out using electrochemistry in lieu of purely chemical oxidation. Accordingly, and in contrast to conventional CMP systems, the slurry 14 need not contain an oxidizing component, although one or more may be added as desired. For example, oxidants such as potassium hydroxide, ferric nitrate or hydrogen peroxide may be added along with buffers such as ammonium persulfate, ammonium chloride or the like. As the skilled artisan will appreciate, the desired composition of an oxidant slurry will depend on the material to be polished.

Figure 2:
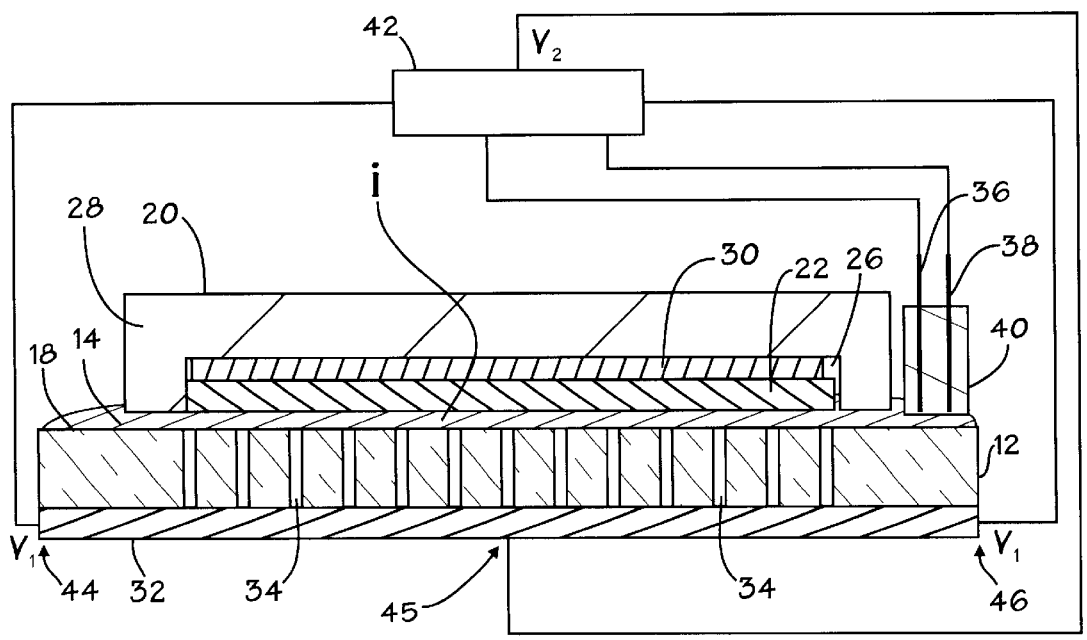
FIG. 2 is a cross-sectional view of FIG. 1 taken at section 2—2 in accordance with the present invention.

A member 20 is provided for holding a semiconductor wafer or workpiece 22 such that a lower surface 24 thereof is maintained in contact with the slurry 14. The member 20 is provided with a cylindrical recess 26 that defines a downwardly projecting retaining ring 28 that is large enough in internal diameter to hold the semiconductor workpiece 22 as shown in FIG. 2. A backside pad 30 is disposed between the member 20 and the semiconductor workpiece 22 as shown. The backside pad 30 is a disk-like member preferably composed of a compliant material, such as, for example, rubber, various well-known synthetic rubber or polymeric materials.

In order to facilitate polishing of the workpiece 22, various types of relative movement between the member 20 and the table 12 may be provided. For example, the member 20 may be held stationary relative to the table 12 or rotated about the axis 16 in either direction, vis-a-vis, the same direction of rotation as the table 12 or the opposite direction. In addition, the member 20 may be moved in other senses relative to the table 12 as desired. For example, the member 20 may be moved across the upper surface 18 of the table 12 during rotation of either the table 12 or the member 20 or both as desired. This translation relative to the table 12 may be linear, orbiting or some other type of motion.

Figure 3:
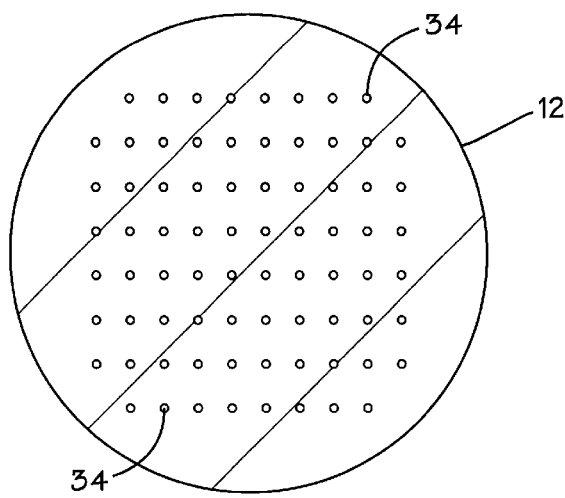
FIG. 3 is a cross-sectional view of FIG. 1 taken at section 3—3 in accordance with the present invention.

The table 12 is provided with a conductor 32 that functions as a working electrode and is in fluid communication with the slurry solution 14 by way of a plurality of bores 34. The conductor or electrode 32 is advantageously composed of a corrosion resistant conducting material, such as, for example, stainless, gold, platinum or the like. As best seen in FIG. 3, which is a cross-sectional view of FIG. 1 take at section 3—3, the bores 34 maybe arranged in an array that spans a sizeable portion of the table 12. As described in more detail below, electrochemical reactions occur at the interface between the slurry solution 14 and the electrode 32 within the bores 34. Accordingly, a large number of bores 34 may aid enhancing the uniformity in concentration of products produced by those electrochemical reactions. However, the number, size and arrangement of the bores 34 is largely a matter of design discretion.

The conductor 32 functions as a working electrode. In order to complete an electrochemical circuit, a counter electrode 36 and a reference electrode 38 are situated in an electrode housing 40 that is brought into contact with the solution 14. The counter electrode 36 is advantageously composed of a corrosion resistant conducting material, such as, for example, stainless, gold, platinum or the like. The reference electrode 38 may be configured as a well-known and commonly used silver/silver chloride electrode. Other types of reference and quasi-reference electrodes may be used, such as a saturated calomel electrode or even a platinum wire at a floating potential. As used herein, the phrase "reference electrode" is intended to mean reference and quasi-reference electrodes.

The electrode housing 40 is advantageously composed of an electrically insulating material that prevents shorts between the counter electrode 36 and the reference electrode 38. The electrode housing 40 is positioned vertically relative to the table 12 so that the counter electrode 36 and the reference electrode 38 are maintained in physical contact with the slurry 14.

The conductor 32, the counter electrode 36 and the reference electrode 38 are connected to a voltage source 42, represented schematically in FIGS. 1 and 2. Note that where the table 12 is configured to rotate, the electrical connection between the voltage source 42 and the electrodes 36 and 38 should be capable of accommodating rotation. The voltage source 42 is designed to maintain desired set potentials $V_1$ and $V_2$ at positions 44, 45 and 46 of the conductor 32. The set potentials $V_1$ and $V_2$ have disparate values and the positions 44, 45 and 46 are spatially separated so that an electric potential gradient is established. As described more fully below, the spatial gradient in electrochemical potential can produce a spatially dependent electrochemistry within the slurry 14. In this way, electrochemical reactions of interest in CMP maybe modulated across a given space, such as across the lower side 24 of the workpiece 22.

In an exemplary embodiment the voltage source 42 is a potentiostat. The voltage source 42 will include a power supply, a current sensor or meter and a regulator. The regulator may be an operational amplifier, an integrated circuit or other type of device. Any of a variety of commercially available potentiostats may be used with the CMP system 10. Although a potentiostat lends itself readily to the task of regulating the potential at the working electrode 32, the skilled artisan will appreciate that other components will serve the function. That is, components with a power supply capable of providing a set potential at various points on the conductor 32.

In operation, the conductor 32 works in concert with the counter electrode 36 and the reference electrode 38 to function as a three-cell electrochemical cell. A controlled potential is maintained between the points 45, 45 and 46 on the conductor 32 and the slurry 14 using the reference potential of the reference electrode 38.

The establishment and utilization of the electric potential gradient will now be described. Because the potentiostat 42 is used to clamp the potential between point 45 and the two ends 44 and 46 of the working electrode 32, the applied potential between the points 44 and 45 and 45 and 46 varies linearly with position. The in-plane electric potential gradient in the electrode 32 means that, relative to a solution reference couple, electrochemical reactions occur at defined spatial positions. The spatial gradient in electrochemical potential can then produce spatially dependent electrochemistry.

Figure 4:
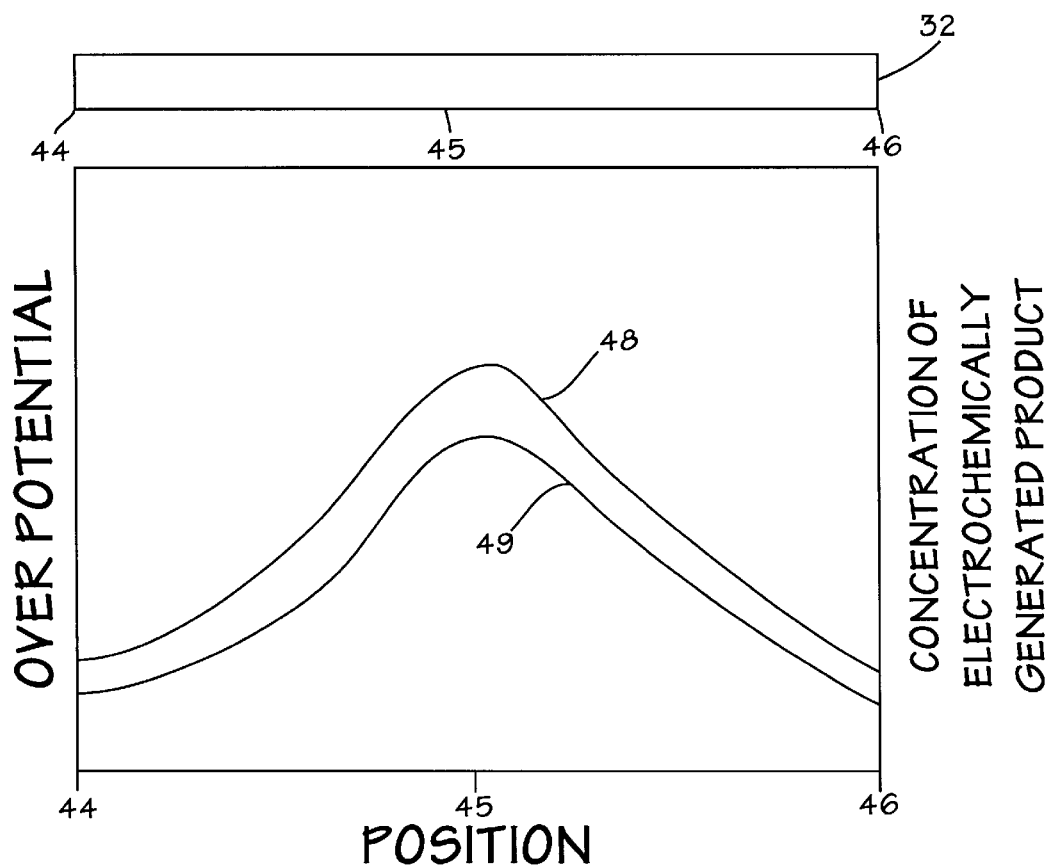
FIG. 4 is a plot of overpotential as a function of position with a schematic of a working electrode superimposed overhead in accordance with an exemplary embodiment of the present invention.

If $V_1$ and $V_2$ both exceed a redox potential for a given reaction, then an electrochemical reaction will occur across the whole electrode 32. The generation of $H_2O_2$ will be used to illustrate the technique. To generate $H_2O_2$, both $V_1$ and $V_2$ are set more positive than the redox potential for $H_2O_2$ formation. Peroxide will form at the electrode 32 and travel up through the bores 34 to the surface 24 of the workpiece 22 and serve as a CMP oxidant. The amount of $H_2O_2$ generated will be proportional to the local overpotential, and the local overpotential, in turn, varies with position between point 45 and points 44 and 46. The general relationship for local over potential versus position where $V_1$ and $V_2 > E_{red}$ for $H_2O_2$ is shown in FIG. 4, which is a plot of over potential as a function of position with a schematic of the electrode 32 superimposed overhead. The x-axis shows the three points 44, 45 and 46 on the electrode 32 and the left y-axis shows the overpotential. Note from the curve 48 that the overpotential is maximum at point 45 and minimum at points 44 and 46. The right y-axis shows concentration of electrochemically generated product. Note that the plot 49 shows the concentration $H_2O_2$ as a function of position and follows the same general relationship as the curve 48, deviating slightly due to mass transport effects and the non-linearity of a typical current-potential characteristic.

The actual total generation rate of $H_2O_2$ may be determined by measuring the interfacial current i flowing in the solution 14 with the potentiostat 42. This follows from the stoichiometry of the reduction of water to $H_2O_2$ wherein one electron is added per molecule of peroxide formed. The actual $H_2O_2$ generation rate, and thus the etch rate, as a function of position may be determined by performing a polish on the workpiece 22 using known set potentials $V_1$ and $V_2$ and the polish time. The post-polish profile of the workpiece 22 may then be determined using well-known metrology techniques and used to calculate polish rate and the non-uniformity of the polish rate across the workpiece 22.

In the set up shown, and assuming that $V_2$ is set higher than $V_1$ a center-fast polish will result. However, by changing either $V_1$, $V_2$ or the positions at which they are applied, the local $H_2O_2$ concentration could be readily manipulated to effect a center-fast polish or an edge-fast polish. Indeed, the skilled artisan will appreciate that the potentials may be applied at various locations at various values. Accurate, localized control of polish rate may be achieved.

Unlike conventional CMP, no chemical oxidizing agent need be present in the slurry 14 although it could be optionally added if desired. The rate of the oxidation of the lower surface 24, and therefore the polish rate, can be increased by simply applying a more anodic potential between the working electrode 32 and the counter electrode 36. Since the oxidation rate of the lower surface 24 is not limited by the mass transport of an oxidant molecule in the slurry 14, the maximum oxidation rate achievable using the system 10 will be greater than in conventional CMP.

Another significant benefit flows from the CMP system 10. For certain slurry compositions, the static etch rate of the slurry could be set to zero simply by disabling the application of bias between the counter electrode 36 and the electrode 32. If necessary, the bias for a reverse electrochemical reaction may be applied to consume any oxidant already produced. For example, $H_2O_2$ could be oxidized to water. This capability may be useful in the event of tool shut down due to mechanical failure, electrical outage or some other cause. In conventional CMP systems, tool aborts may result in a static etch rate due to overexposure to slurry which can result in excessive dishing, seam attack and other problems.

Figure 5:
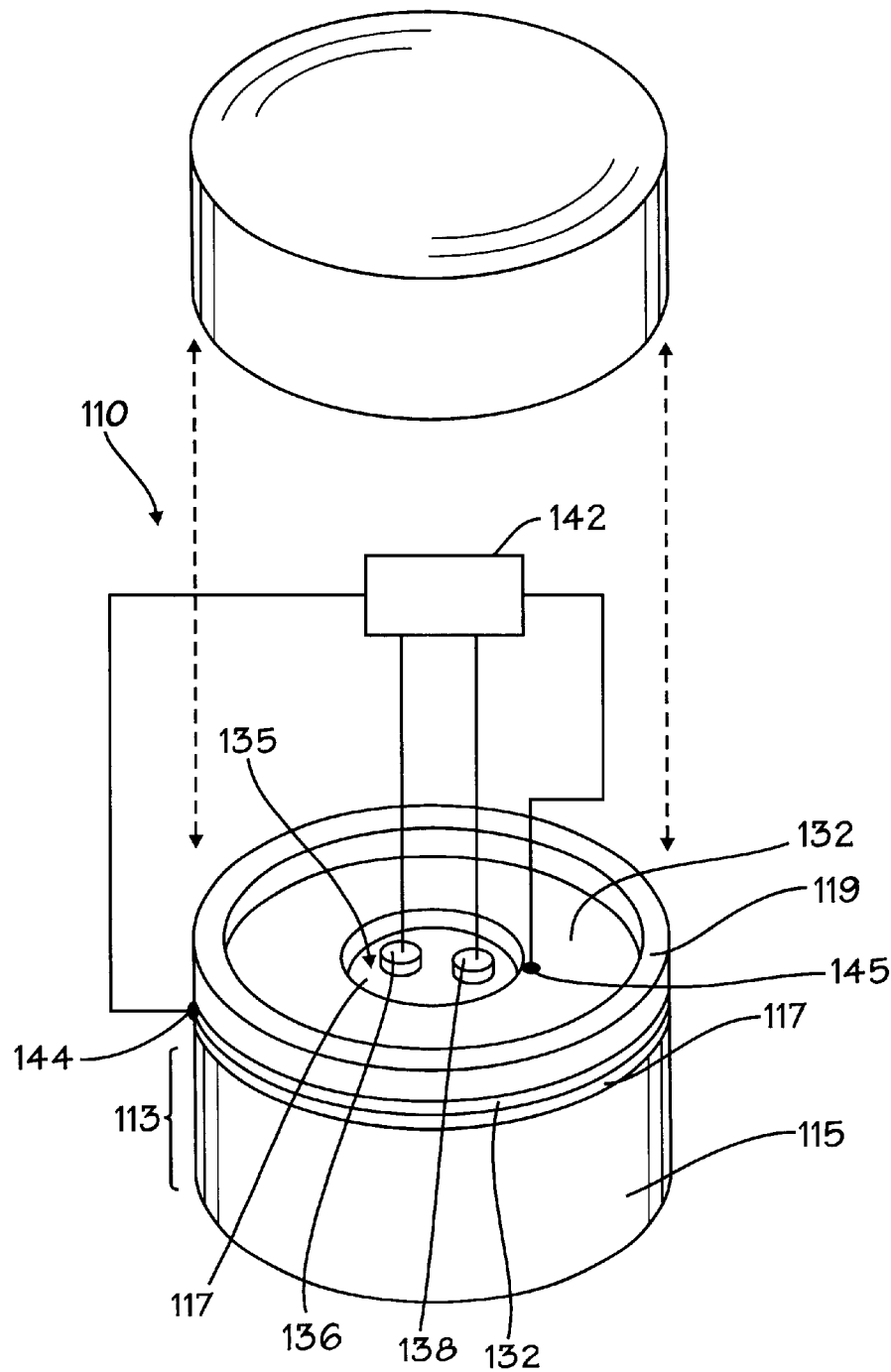
FIG. 5 is a partially exploded pictorial view of an alternate exemplary embodiment of the chemical mechanical polishing system in accordance with the present invention.

In the embodiment illustrated in FIGS. 1, 2 and 3, an electrode housing 40 including a counter electrode 36 and a reference electrode 38 is brought into contact with the slurry solution 14 from above. However, this arrangement is merely illustrative. In this regard, an alternate exemplary embodiment of the CMP system 110 may be understood by referring now to FIG. 5. FIG. 5 is a partially exploded pictorial view showing the polish table 112 exploded from an underlying base structure 113 that consists of a base 115 that may be constructed of metal, plastics or other well-known materials, and an insulating film or disk 117 that may composed of like materials. An electrode member 132 of the composition described elsewhere herein is positioned on the film 117 and an optional insulating annular member 119 is provided upon which the table 112 is seated. The electrode member 132 is provided with a centrally located bore 135 in which a counter electrode 136 and a reference electrode 138 are positioned and sealed on the insulating film 117. The counter electrode 136 and the reference electrode 138 are connected to a voltage source 142 of the type described elsewhere herein. Bias is applied to two points 144 and 145 of the electrode 156 by the voltage source 142. Although the voltage source 142 and the leads or conductors to the counter electrode 136, the reference electrode 138 and the contact points 144 and 145 are shown projecting above the base structure 113 for simplicity of illustration, it is anticipated that a beuer arrangement may be had by routing any electrical connections up through the bottom of the base 115 to make contact to the various members of interest.

In operation, the slurry solution will fill the bore 135 enabling completion of the electrochemical circuit. The optional annular member 119 provides a space for the slurry solution to occupy and enable ready fluid communication to any of the bores (not visible) in the table 112.

Figure 6:
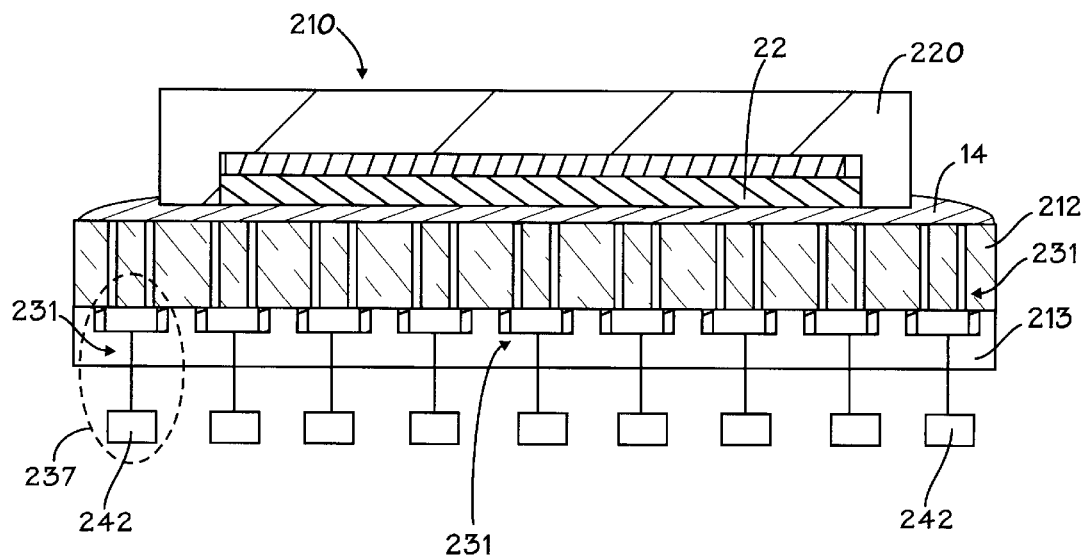
FIG. 6 is a cross-sectional view like FIG. 2, but of another alternate exemplary embodiment of the chemical mechanical polishing system in accordance with the present invention.
Figure 7:
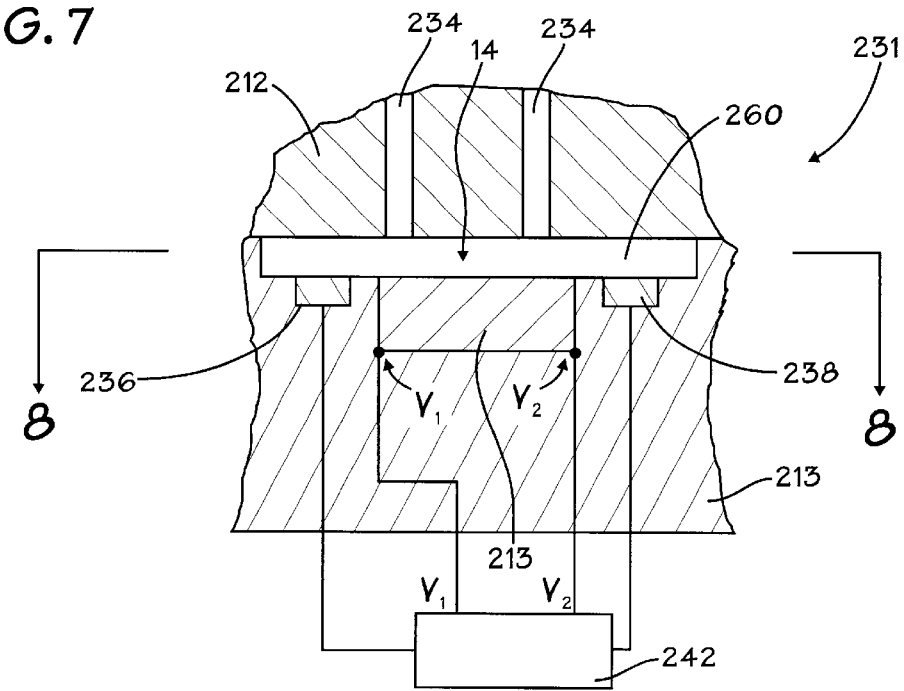
FIG. 7 is a magnified view of a portion of FIG. 6 in accordance with the present invention.

Another alternate exemplary embodiment in accordance with the present invention may be understood by referring now to FIGS. 6 and 7. FIG. 6 is a cross-sectional view similar to FIG. and FIG. 7 is a magnified cross-sectional view of a selected portion of FIG. 6. Referring initially to FIG. 6, this embodiment of the CMP system 210 includes a member or table 212 and If a carrier 220 for holding the workpiece 22. The table 212 is positioned on a base 213. The base is provided with a plurality of electrode sets 231. The detailed structure of the electrode sets 231 may be understood by referring now also to FIG. 7, which is a magnified cross-sectional view of the portion of FIG. 6 circumscribed generally by the dashed oval 237. Each of the electrode sets 231 has a working electrode 232, counter electrode 236, a reference electrode 238 and a voltage source 242. The electrodes 232, 236 and 238 are coupled to the voltage source 242 to function in an electrochemical sense as described generally elsewhere herein. The working electrode 232 may be molded or otherwise connected to the base member 213 and connected electrically at points 244 and 246 to the voltage source 242. Although each electrode set 231 is provided with separate counter electrode 236 and reference electrode 238, another option may be implemented wherein multiple working electrodes 232 might share a common reference electrode and/or a counter electrode.

Figure 8:
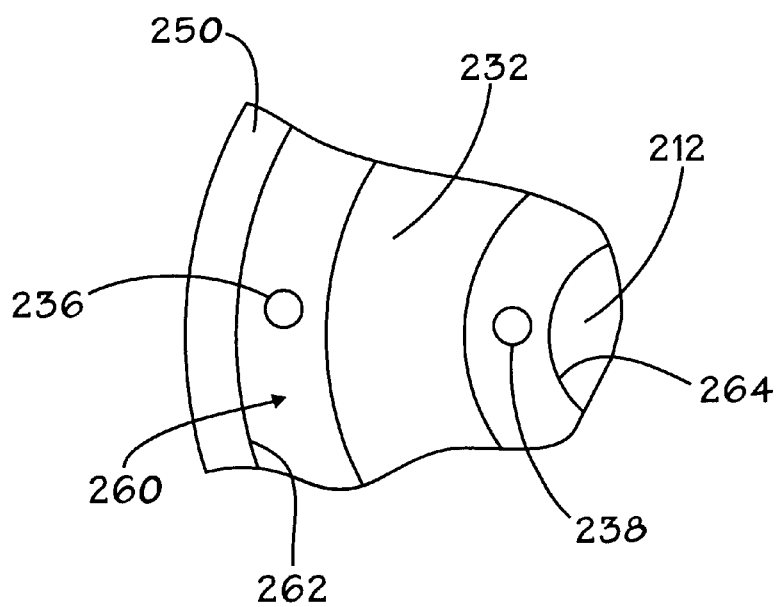
FIG. 8 is a cross-sectional view of FIG. 7 taken at section 8—8 in accordance with the present invention.

The base member 213 is provided with a space 260. The configuration of the space may be understood by referring now also to FIG. 8, which is a cross-sectional view of FIG. 7 taken at section 8—8. The space 260 has an outer annular edge 262 and an inner annular edge 264. In this way, the space 260 and the working electrode 232 may be generally annular in shape, which is a convenient shape to use for a disk configured base 250. However, the skilled artisan will appreciate that the precise geometric configurations of the working electrode 232 and the space 260 are largely matters of design discretion. Note that the counter electrode 236 and the reference electrode 238 are positioned in the space 260, preferably in relative close proximity.

In operation, the plurality of electrode sets 231 may be operated in concert, that is, all together. Optionally, one, two, three or any number of the electrode sets 231 may be operated at a given moment. Furthermore, each of the electrode sets 231 maybe set at the same potentials or at different potentials so that a particular overpotential gradient is provided across the surface of the workpiece 222. For example, the left-most and right-most depicted electrode sets 231 may be operated at higher overpotentials than one or more of the centrally located electrode sets 231 so that an edge fast polish may be produced.

The electrochemical generation of hydrogen peroxide and/or water has been used to illustrate embodiments of the present invention. However, the skilled artisan will appreciate that a variety of chemical species useful in CMP maybe generated in accordance with the present invention. Various oxidizing agents and complexing agents may be created electrochemically. For example, aqueous ammonium ions used as a complexing agent in copper CMP may be reduced electrochemically to evolve ammonia and control polish rate.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A processing device, comprising:
   a member for polishing a surface of a semiconductor workpiece with the aid of a solution;
   a working electrode in fluid communication with the solution;
   a counter electrode in fluid communication with the solution;
   a potential source coupled to the wording electrode and the counter electrode for applying a potential difference between the working electrode and the counter electrode to electrochemically generate a chemical species in the solution to aid in the polishing of the surface of the semiconductor workpiece.

2. The processing device of claim 1, wherein the member comprises at least one passage to enable fluid communication between the solution and the working electrode.

3. The processing device of claim 2, wherein the working electrode is coupled to the member.

4. The processing device of claim 3, wherein the counter electrode is coupled to the member.

5. The processing device of claim 1, comprising a reference electrode in fluid communication with the solution.

6. The processing device of claim 5, wherein the reference electrode is coupled to the member.

7. The processing device of claim 1, wherein the potential source comprises one conductor coupled to the working electrode at a first position and a second conductor coupled to the working electrode at a second position, the potential source being operable to set a first potential at the first position and a second potential different from the first potential at the second position to establish an in-plane potential gradient in the working electrode that establishes an electrochemical potential gradient in the solution.

8. The processing device of claim 1, wherein the potential source comprises a potentiostat.

9. A processing device, comprising:
   a member for polishing a surface of a semiconductor workpiece with the aid of a solution; and
   a plurality of electrochemical cells, each of the plurality of electrochemical cells having a working electrode, a counter electrode and a reference electrode in fluid communication with the solution, and a potential source coupled to the working electrode and the counter electrode for applying a potential difference between the working electrode and the counter electrode to electrochemically generate a chemical species in the solution to aid in the polishing of the surface of the semiconductor workpiece.

10. The processing device of claim 9, wherein the potential difference for each of the plurality of the electrochemical cells is the same.

11. The processing device of claim 9, wherein the plurality of electrochemical cells is coupled to the member.

12. The processing of claim 9, wherein the member comprises a base and a polish pad coupled to the base, the interface between the base and polish pad defining a plurality of spaces, the working electrode, the counter electrode and the reference electrode of a given electrochemical cell being positioned in one of the plurality of spaces, the member having a plurality of passages to enable the chemical species generated in the plurality of spaces to flow to the semiconductor workpiece.

13. The processing device of claim 9, wherein each of the plurality of potential sources comprises one conductor coupled to the working electrode at a first position and a second conductor coupled to the working electrode at a second position, the potential source being operable to set a first potential at the first position and a second potential different from the first potential at the second position to establish an in-plane potential gradient in the working electrode that establishes an electrochemical potential gradient in the solution.

14. The processing device of claim 13, wherein each of the plurality of potential sources comprises a potentiostat.

15. A processing device, comprising:
- a member for polishing a surface of a semiconductor workpiece with the aid of a solution;
- a plurality of working electrodes in fluid communication with the solution;
- a counter electrode and a reference electrode in fluid communication with the solution; and
- a plurality of potential sources coupled to the-working electrodes and the counter electrode for applying a potential difference between the working electrodes and the counter electrode to electrochemically generate a chemical species in the solution to aid in the polishing of the surface of the semiconductor workpiece.

16. The processing device of claim 15, wherein the potential difference for each of the plurality of the working electrodes is the same.

17. The processing device of claim 15, wherein the plurality of working electrodes is coupled to the member.

18. The processing of claim 15, wherein the member comprises a base and a polish pad coupled to the base, the interface between the base and polish pad defining a plurality of spaces, a given working electrode being positioned in one of the plurality of spaces, the member having a plurality of passages to enable the chemical species generated in the plurality of spaces to flow to the semiconductor workpiece.

19. The processing device of claim 15, wherein each of the plurality of potential sources comprises one conductor coupled to the working electrode at a first position and a second conductor coupled to the working electrode at a second position, the potential source being operable to set a first potential at the first position and a second potential different from the first potential at the second position to establish an in-plane potential gradient in the working electrode that establishes an electrochemical potential gradient in the solution.

20. The processing device of claim 19, wherein each of the plurality of potential sources comprises a potentiostat.

* * * * *

UNITED STATES PATENT AND TRADEMARK OFFICE
CERTIFICATE OF CORRECTION

PATENT NO. : 6,689,258 B1  
DATED : February 10, 2004  
INVENTOR(S) : Christopher H. Lansford et al.

It is certified that error appears in the above-identified patent and that said Letters Patent is hereby corrected as shown below:

<u>Column 8,</u>  
Line 15, delete "wording" and substitute -- working --.

Signed and Sealed this

First Day of June, 2004

JON W. DUDAS  
*Acting Director of the United States Patent and Trademark Office*